United States Patent [19]

Poppinga

[11] 4,280,103

[45] Jul. 21, 1981

[54] MULTISTAGE TRANSISTOR AMPLIFIER

[75] Inventor: Bonno Poppinga, Berlin, Fed. Rep. of Germany

[73] Assignee: Robert Bosch GmbH, Stuttgart, Fed. Rep. of Germany

[21] Appl. No.: 62,475

[22] Filed: Jul. 31, 1979

[30] Foreign Application Priority Data

Aug. 8, 1978 [DE] Fed. Rep. of Germany ....... 2834641

[51] Int. Cl.$^3$ .............................................. H03F 3/04
[52] U.S. Cl. .................................... 330/290; 330/296; 330/310
[58] Field of Search ................... 330/70, 71, 290, 296, 330/310, 311

[56] References Cited

PUBLICATIONS

Butler "Transistor Wide-Band Cascade Amplifiers", *Wireless World*, Mar. 1965, pp. 124–127.

*Primary Examiner*—James B. Mullins
*Attorney, Agent, or Firm*—Spencer & Kaye

[57] ABSTRACT

A multistage transistor amplifier for amplifying alternating voltages which comprises at least two successive cascade-connected amplifier stages having d.c. feedback. A following amplifier stage is a.c. coupled to the output of the cascade-connected amplifier stages and a resistor is connected between the output of the cascade-connected amplifier stages and the input of the following amplifier stage. The cascade-connected amplifier stages supply the following amplifier stage with direct current, the d.c. operating resistance for the following amplifier stage including the cascade-connected amplifier stages and the resistor.

10 Claims, 1 Drawing Figure

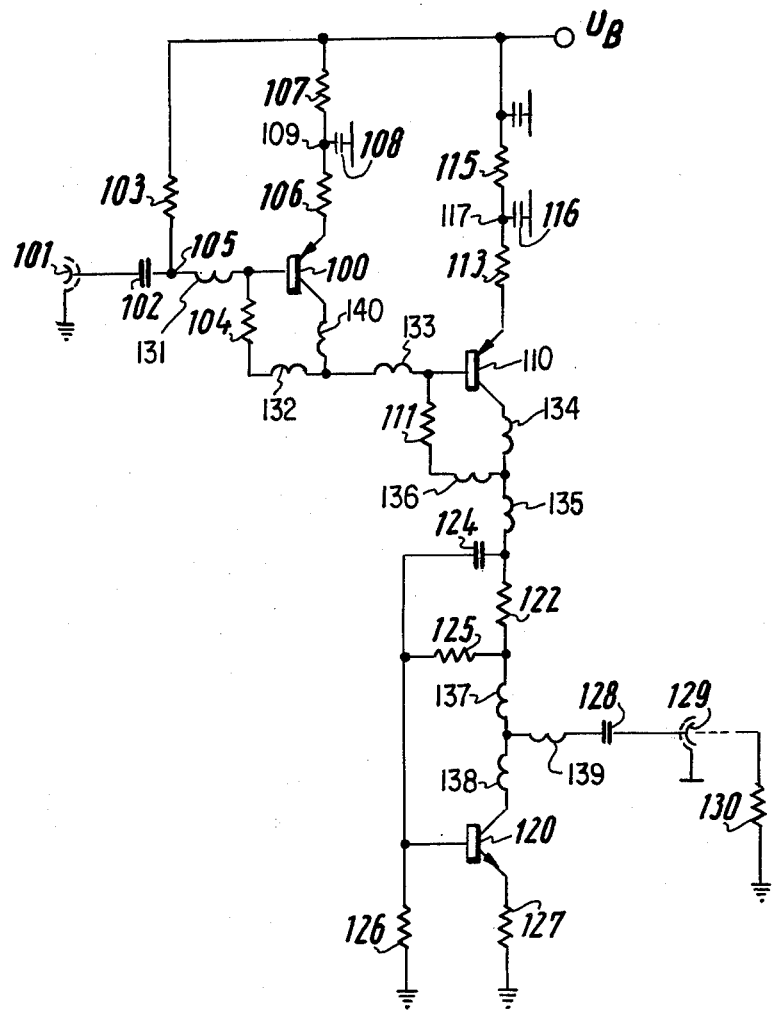

MULTISTAGE TRANSISTOR AMPLIFIER

BACKGROUND OF THE INVENTION

The present invention is related to multistage transistor amplifiers. In particular, it relates to an amplifier which has comparatively low current consumption and which may be fabricated by thin-film hybrid techniques.

Known multistage transistor amplifiers of the type described in the Valvo Handbook, Hybrid Circuits, March 1975, page 505, although they include successive amplifier stages with d.c. feedback, have a relatively high current consumption compared to discrete amplifiers designed for a corresponding output power. Accordingly, it is an object of the present invention to provide a multistage transistor amplifier that, for a given output power, has a greatly reduced current consumption in comparison with that of prior art amplifiers. An advantage of the invention is that a relatively small power supply may be employed thereby significantly decreasing the costs of production and operation.

SUMMARY OF THE INVENTION

The present invention comprises a multistage transistor amplifier for amplifying alternating voltages which comprises at least two successive cascade-connected amplifier stages having d.c. feedback. A following amplifier stage is a.c. coupled to the output of the cascade-connected amplifier stage and a resistor is connected between the output of the cascade-connected amplifier stages and the input of the following amplifier stage. The cascade-connected amplifier stages supply the following amplifier stage with direct current, the d.c. operating resistance for the following amplifier stage including the cascade-connected amplifier stages and the resistor. In addition, the resistor provides a.c. feedback for the following amplifier stage.

BRIEF DESCRIPTION OF THE DRAWING

The drawing figure shows a circuit diagram for a three-stage transistor amplifier in accordance with the invention.

DESCRIPTION OF THE PREFERRED EMBODIMENTS

The FIGURE shows a three-stage transistor amplifier having an input coaxial terminal 101 connected by a coupling capacitor 102 to the base electrode of a type PNP transistor 100.

A voltage divider comprising resistors 103, 104, 111, 122, 125 and 126 has one end of resistor 103 connected to the positive terminal of a source $U_B$ of operating voltage and one end of resistor 126 connected to the negative terminal of the voltage source. The junction 105 between resistors 103 and 104 is connected to the base electrode of transistor 100. The junction between resistors 104 and 111 is connected to the collector electrode of transistor 100 and to the base electrode of a type PNP transistor 110. Resistor 104, which is connected between the base and collector electrodes of transistor 100, provides both d.c. and a.c. feedback for this transistor.

Resistor 111 is connected between the base and collector electrodes of transistor 110 to provide d.c. and a.c. feedback for this transistor. The emitter electrodes of transistors 100 and 110 are each connected to the positive terminal of the operating voltage source $U_B$ by resistors 106, 107 and 113, 115 respectively. The points of connection 109 and 117 between the respective resistors 106, 107 and 113, 115 are connected to ground via capacitors 108 and 116 respectively.

The collector electrode of transistor 110 is connected by resistor 122 to the collector electrode of a type NPN transistor 120. A capacitor 124 couples the collector electrode of transistor 110 and the base electrode of transistor 120 so that a.c. coupling is obtained between transistors 110 and 120. Together with resistor 122, capacitor 124 provides a.c. feedback for transistor 120. Moreover, resistor 125 establishes d.c. feedback between the collector and base electrodes of transistor 120. The base and emitter electrodes of transistor 120 are connected to ground potential by resistors 126 and 127 respectively. The collector electrode of transistor 120 is connected by a capacitor 128 to a coaxial output terminal 129 to which a load resistance 130 may be connected. Inductances 131 to 140 are provided to produce an amplifier having a predetermined frequency response. For d.c. the inductances are inactive.

During operation of the circuit, the transistors receive the appropriate base bias from the voltages across the respective resistors, the collector current of the cascade-connected transistors 100 and 110 providing the collector current for transistor 120.

The base bias for transistor 100 depends on resistors 103, 104, inductance 131, and the circuit comprising components 111, 113, 115, 117, 120, 122, and 124 to 127 and 132 to 139; the base bias for transistor 110 depends on the circuit of transistor 100 in combination with resistor 111 and components 122, 124, to 127 and 134 to 138; the base bias for transistor 120 depends on voltage divider 125, 126 components 103 to 111, 113 and 115, resistor 122 and inductances 131 to 140.

A small portion of the collector current is diverted to the base of transistor 120. The collector current required for transistor 120 therefore, does not impose an additional load on the operating voltage source and the a.c. power and gain remain unchanged.

This is a significant advantage, particularly with thin-film hybrid amplifiers because, with the same number of components as is used in prior art circuits, the output power is almost doubled. In addition to the advantage of low current consumption, the circuit arrangement according to the invention has the further advantage of providing good temperature stabilization which results from the use of emitter resistances together with voltage feedback in the transistors.

It will be understood that the above description of the present invention is susceptible to various modifications, changes and adaptations, and the same are intended to be comprehended within the meaning and range of equivalents of the appended claims.

What is claimed is:

1. A multistage transistor amplifier for amplifying alternating voltages comprising at least two successive cascade-connected amplifier stages having d.c. feedback, a following amplifier stage a.c. coupled to the output of said cascade-connected amplifier stages, and a resistor coupling said following amplifier stage to said cascade-connected amplifier stages, said cascade-connected amplifier stages supplying said following amplifier stage with direct current, the d.c. operating resistance for said following amplifier stage including said cascade-connected amplifier stages and said resistor.

2. A multistage transistor amplifier as defined in claim 1 wherein said resistor is connected to provide a.c. feedback for said following amplifier stage.

3. A multistage transistor amplifier as defined in claims 1 or 2 wherein said resistor is connected in series with said cascade-connected amplifier stages.

4. A multistage amplifier for amplifying alternating voltages comprising:
input and output terminals;
an input amplifier comprising at least two cascade-connected stages having d.c. feedback, the input of said amplifier being coupled to said input terminal;
a first resistor and a first capacitor each having one end connected to the output of said input amplifier; and
a following amplifier comprising a first transistor having first, second and third electrodes, the first electrode of said transistor being connected to the other end of said first resistor and to said output terminal, said second electrode being connected to the other end of said first capacitor and said third electrode being coupled to one terminal of a source of operating voltage, the cascade-connected stages of said input amplifier being coupled to the other terminal of said source of operating voltage and providing said following amplifier with direct current, the d.c. operating resistance for said following amplifier stage including said cascade-connected amplifier stages and said first resistor.

5. A multistage amplifier as defined in claim 4 wherein the first, second and third electrodes of said first transistor are collector, base and emitter electrodes respectively.

6. A multistage amplifier as defined in claim 5 wherein said at least two cascade-connected stages of said input amplifier comprise second and third transistors each having collector, base and emitter electrodes.

7. A multistage amplifier as defined in claim 6 which further includes a resistance voltage divider coupled across the terminals of said source of operating voltage, said voltage divider including second, third and fourth resistors connected between the base and collector electrodes of said first, second and third transistors respectively, the collector electrode of said third transistor being connected to said one end of said first resistor and first capacitor.

8. A multistage amplifier as defined in claim 7 wherein the emitter electrode of said first transistor is coupled by a fifth resistor to said one terminal of said source of operating voltage and the emitter electrodes of said second and third transistor are coupled by sixth and seventh resistor respectively to the other terminal of said source of operating voltage.

9. A multistage amplifier as defined in claims 7 or 8 wherein said first transistor is a type NPN and said second and third transistors are type PNP.

10. A multistage amplifier as defined in claims 7 or 8 wherein the base electrode of said second transistor is coupled to said input terminal by a second capacitor and the collector electrode of said first transistor is coupled to said output terminal by a third capacitor.

* * * * *